(12) United States Patent
Matsumoto

(10) Patent No.: US 7,265,841 B2
(45) Date of Patent: Sep. 4, 2007

(54) POSITION DETECTING METHOD

(75) Inventor: Takahiro Matsumoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 407 days.

(21) Appl. No.: 10/872,031

(22) Filed: Jun. 18, 2004

(65) Prior Publication Data
US 2004/0257573 A1 Dec. 23, 2004

(30) Foreign Application Priority Data
Jun. 18, 2003 (JP) .............................. 2003-174081

(51) Int. Cl.
G01B 11/00 (2006.01)
(52) U.S. Cl. ..................................... 356/401
(58) Field of Classification Search ......... 356/399–402
See application file for complete search history.

(56) References Cited

U.S. PATENT DOCUMENTS 4,971,444 A * 11/1990 Kato ........................... 356/401
5,943,638 A * 8/1999 Aoyagi ........................ 702/150
5,976,738 A * 11/1999 Nakashima ................... 430/22
6,083,807 A * 7/2000 Hsu ............................. 438/401
6,097,473 A * 8/2000 Ota et al. ...................... 355/53
6,490,026 B1 * 12/2002 Watanabe et al. ............. 355/53

FOREIGN PATENT DOCUMENTS

JP  05-062879  3/1993
JP  09-186222  7/1997

* cited by examiner

Primary Examiner—Tarifur Chowdhury
Assistant Examiner—Isiaka O. Akanbi
(74) Attorney, Agent, or Firm—Morgan & Finnegan, LLP

(57) ABSTRACT

A method for calculating a position of an image of an alignment mark formed on an object to be detected includes the steps of obtaining first information indicative of a center position in the alignment mark based on a detection signal, obtaining a waveform characteristic of the detection signal as second information, and correcting the first information based on the second information that has been obtained, and a measurement error of the center position of the alignment mark, which result from an optical system for detecting the alignment mark.

4 Claims, 17 Drawing Sheets

POSITION DETECTING METHOD

This application claims a benefit of foreign priority based on Japanese Patent Application No. 2003-174081, filed on Jun. 18, 2003, which is hereby incorporated by reference herein in its entirety as if fully set forth herein.

BACKGROUND OF THE INVENTION

The present invention relates to a position detecting method, and more particularly to a position detecting method used for an alignment for a wafer in a semiconductor exposure apparatus. The present invention is suitable, for example, for a position detecting method used to manufacture various devices including semiconductor chips such as ICs and LSIs, display devices such as liquid crystal panels, sensing devices such as magnetic heads, and image pick-up devices such as CCDs.

Recent high performance and inexpensive electronic apparatuses needs more economic and precise manufacturing of semiconductor installed in them, and requires an exposure apparatus that exposes a semiconductor circuit pattern to have precision and efficiency in a process of transferring a circuit pattern on a reticle or a mask (collectively referred to as a "reticle" hereinafter) onto a wafer and a glass plate (collective referred to as a "wafer" hereinafter), on which a photosensitive material (referred to as "resist" hereinafter) is applied. In general, precise exposure of a circuit pattern requires a precise alignment between the reticle and the wafer.

A conventional alignment method exposes alignment marks on a wafer at the same time when the circuit pattern on the reticle is exposed, and sequentially measures positions of plural preset alignment marks among the alignment marks for all the shots using an alignment detection optical system. After the position measurement result is statistically processed to calculate the entire shot arrangement, and the wafer is positioned to the reticle based on the calculation result.

The alignment marks are indexes to align the reticle with the wafer with high precision. Fine circuit patterns require a precise alignment between a reticle and a wafer; the necessary precision is about ⅓ of a circuit critical dimension, e.g., 60 nm that is ⅓ as long as the current design width of 180 nm. The recently introduced special semiconductor manufacture technology, such as a chemical mechanical polishing ("CMP") process causes scattering among shapes of the alignment marks among wafers and among shots, and deteriorate the alignment accuracy. Other factors, which result from apparatus's performance, also deteriorate the alignment accuracy, such as inclination errors in the illumination optical system, and a coma. In this case, the process condition varies in the apparatus to set a suitable condition for both the alignment mark and circuit pattern. Plural types of alignment marks with different widths are produced for exposure evaluations, and the alignment mark having a certain is selected for a certain process condition, which is supposed to provide the highest precision.

Prior art relating to a position detecting method includes, for example, Japanese Patent Applications, Publication Nos. 05-062879 and 09-186222.

Optimal conditions for the semiconductor device manufacture process are manually calculated and require a long time. Even after a parameter is determined, it is necessary to manually recalculate and change the manufacture process when the process error occurs. This modification also requires a long time. Therefore, the conventional alignment process requires an extremely long time, lowering the yield of the semiconductor device manufacturing.

It is predicted that the finer processing of a circuit pattern will be demanded, a new semiconductor process will be introduced, and a wafer diameter will become larger, for example, 300 mm. Accordingly, in addition to a problem of the yield, precise manufacturing of both the circuit pattern and the alignment mark on the whole wafer surface without defect will become more and more difficult.

BRIEF SUMMARY OF THE INVENTION

Accordingly, it is an exemplified object of the present invention to provide a position detecting method that maintains precision and improves yield even when shapes of alignment marks scatter.

A method for calculating a position of an image of an alignment mark formed on an object to be detected includes the steps of obtaining first information indicative of a center position in the alignment mark based on a detection signal, obtaining a waveform characteristic of the detection signal as second information, and correcting the first information based on the second information that has been obtained, and a measurement error of the center position of the alignment mark, which result from an optical system for detecting the alignment mark.

Other objects and further features of the present invention will become readily apparent from the following description of the embodiments with reference to accompanying drawings.

DETAILED DESCRIPTION OF THE PREFERRED EMBODIMENTS

Figure 1:
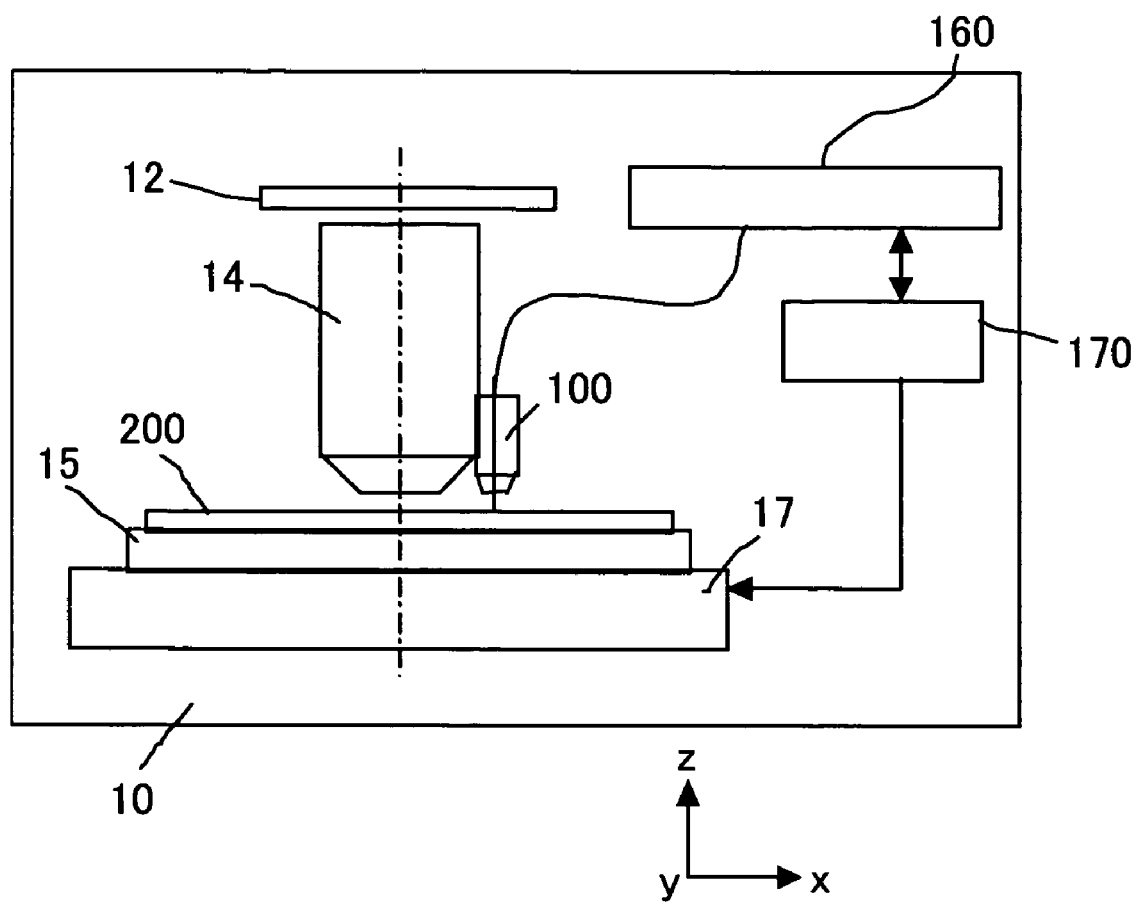
FIG. 1 is a schematic view of an exposure apparatus that uses an inventive position detecting method of one embodiment according to the present invention.

A description will now be given of an inventive position detecting method, with reference to accompanying drawings. The same element in each figure is designated by the same reference numeral, and a description thereof will be omitted. FIG. 1 is a schematic view of an exposure apparatus 10 that uses an inventive position detecting method.

The exposure apparatus 10 exposes a wafer 200 by illuminating a reticle 12 using an illumination optical system (not shown), and transferring diffracted light from the reticle onto the wafer 200 located on a wafer stage 17 via a projection optical system 14. The exposure apparatus 10 includes a reticle 12 that forms a certain circuit pattern, a projection optical system 14 that projects the reticle 12, a wafer 200 on which a primary pattern and an alignment mark are formed in a previous step, a wafer chuck 15 for holding the wafer 200, a wafer stage 17 that positions the wafer chuck 15 and the wafer 200 at a predetermined position, an alignment detection optical system 100 for measuring a position of the alignment mark on the wafer, etc.

Figure 2:
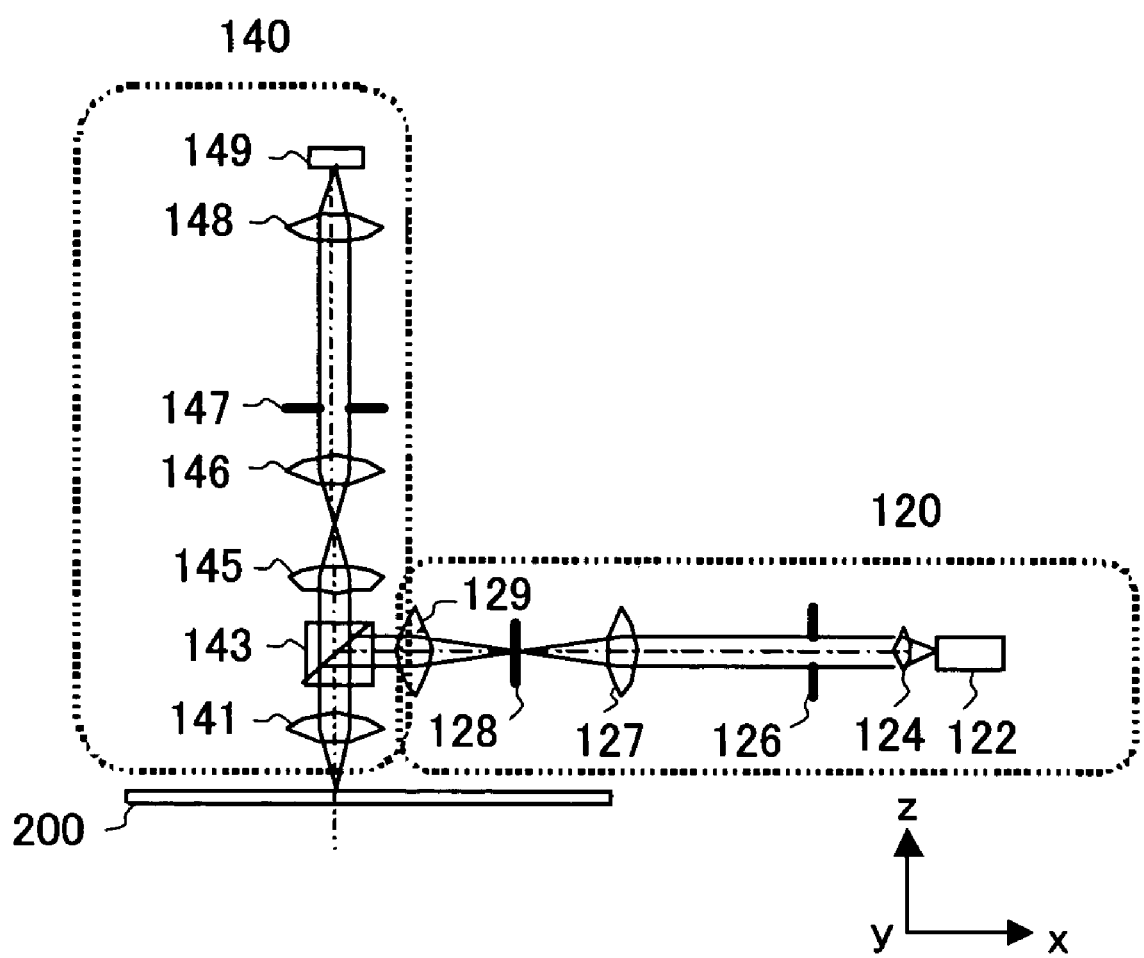
FIG. 2 is a schematic sectional view of an alignment detection optical system.

A description will now be given of a principle of the alignment detection optical system 100 used for the exposure apparatus 10. FIG. 2 shows a schematic sectional view of the alignment detection optical system 100 shown in FIG. 1. FIG. 2 shows an embodiment of the alignment detection optical system for detecting a position in an X direction ("X alignment detection optical system"). An alignment detection optical system for detecting a position in a Y direction is configured by rotating, by 90° degrees about a z-axis, the X alignment detection optical system, and a description thereof will be omitted.

The alignment detection optical system 100 includes an illumination optical system 120 and an imaging system 140. A lens 124 enlarges and collimates illumination light from a light source 122 in the illumination optical system, and a lens 127 condenses the resultant light again. A variable aperture stop 126 adjusts the coherency or coherence factor (s) of the illumination light. An aperture 128 is located at a position conjugate with the wafer 200, and serves as a field stop for preventing unnecessary light from illuminating an area around the alignment mark on the wafer 200. The light condensed by the lens 127 is again collimated by a lens 129, reflected by a beam splitter 143, passes through a lens 141, and illuminates the alignment mark 210 on the wafer 200. The light reflected from the alignment mark 210 passes through a lens 141, a beam splitter 143, lenses 145, 146 and 148 in the imaging system 140, and is received by a line sensor 149. A variable aperture stop 147 can adjust a numerical aperture ("NA") in the imaging system 140. The alignment mark 210 is imaged on the line sensor 149 while enlarged at an imaging magnification of about 100 times.

Figure 3:
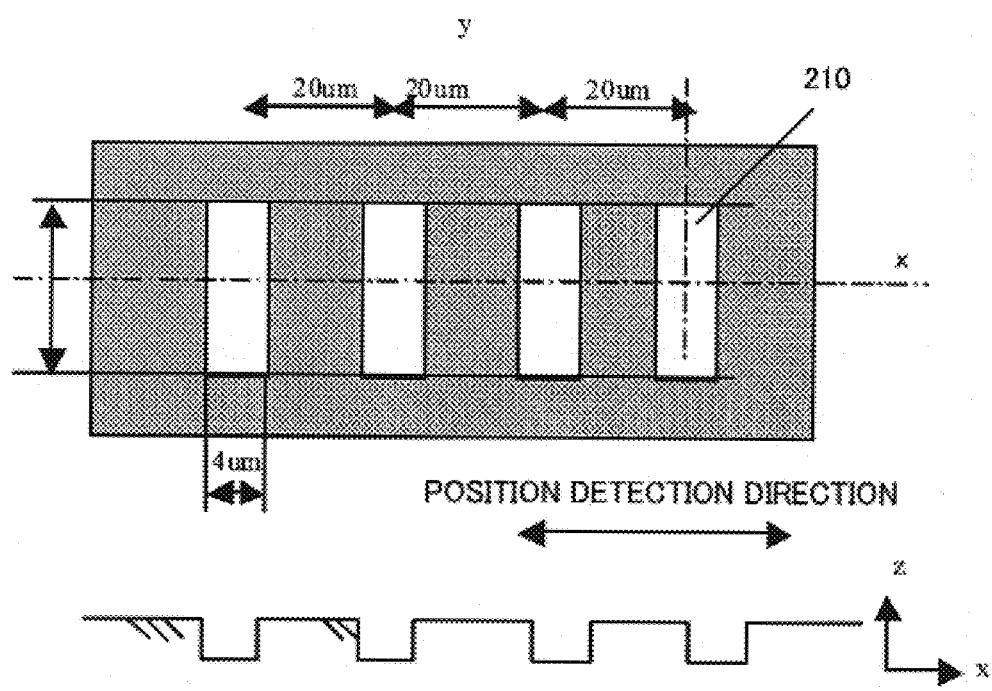
FIG. 3 is a schematic plane view showing one example of an alignment mark measured by the alignment detection optical system shown in FIG. 2.
Figure 4:
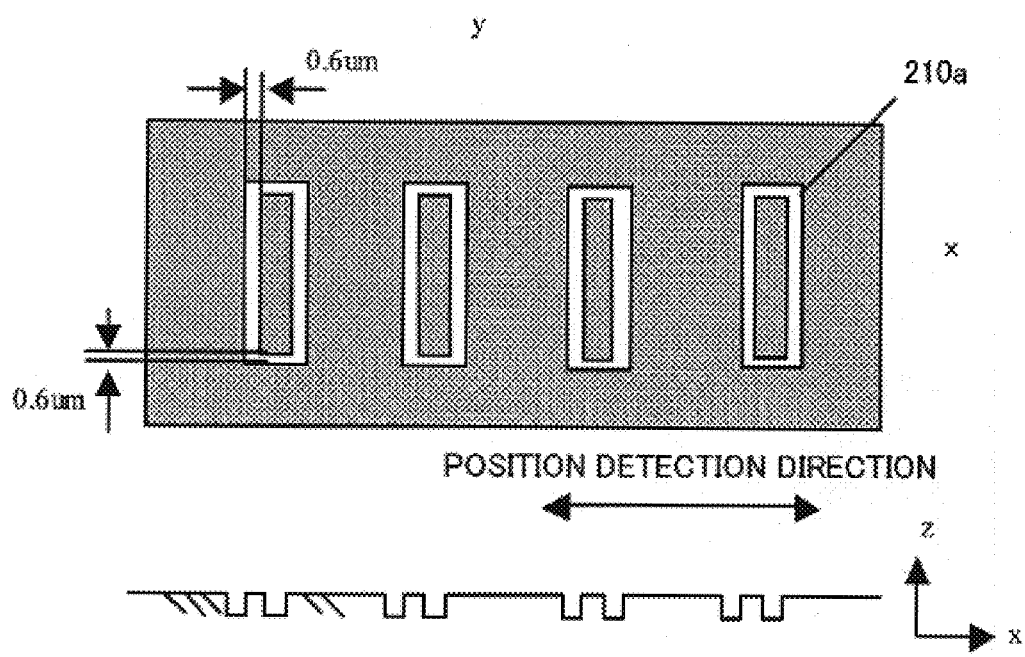
FIG. 4 is a plane view showing another example of an alignment mark different from that shown in FIG. 3.
Figure 5:
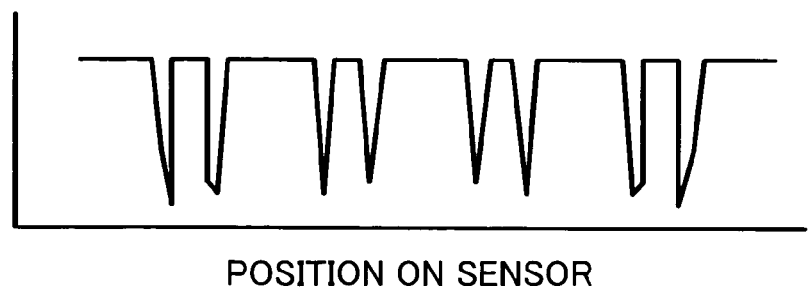
FIG. 5 is a graph showing one example of an alignment signal measured by the alignment detection optical system shown in FIG. 1.

The alignment mark 210 can exemplarily use approximately rectangular marks shown in FIGS. 3 and 4. Here, FIG. 3 is a schematic plane view showing one example of an alignment mark 210 measured by the alignment detection optical system 100 shown in FIG. 2. FIG. 4 is a schematic plane view showing another example of an alignment mark 210 different from that shown in FIG. 3. In FIG. 3, the alignment mark 210 is formed as a concave shape in its sectional structure by etching, and four rectangular alignment marks 210 are arranged at a pitch of 20 μm in a direction X, each of which has a size of 4 μm in a measurement direction X and 20 μm in a non-measurement direction Y. The alignment mark 210 applies a resist (not shown) to its surface. The alignment mark 210a in FIG. 4 replaces a contour of the mark element 210 in FIG. 3 with a line width of 0.6 μm. Whichever the alignment mark 210 or 210a is used, the line sensor 149 generally takes an image as shown in FIG. 5, due to a generation and interference of scattered light at a lens' edge outside its NA in the alignment detection optical system 100. Here, FIG. 5 is a graph showing one exemplary alignment signal measured by the alignment detection optical system 100 shown in FIG. 1.

An image taken by the alignment detection optical system 100 uses a bright field image method: The alignment mark 210 has a dark contour, while the alignment mark 210a has a dark or bright concave part.

An alignment signal processor 160 processes a thus taken image of the alignment mark 210 or 210a.

Figure 6:
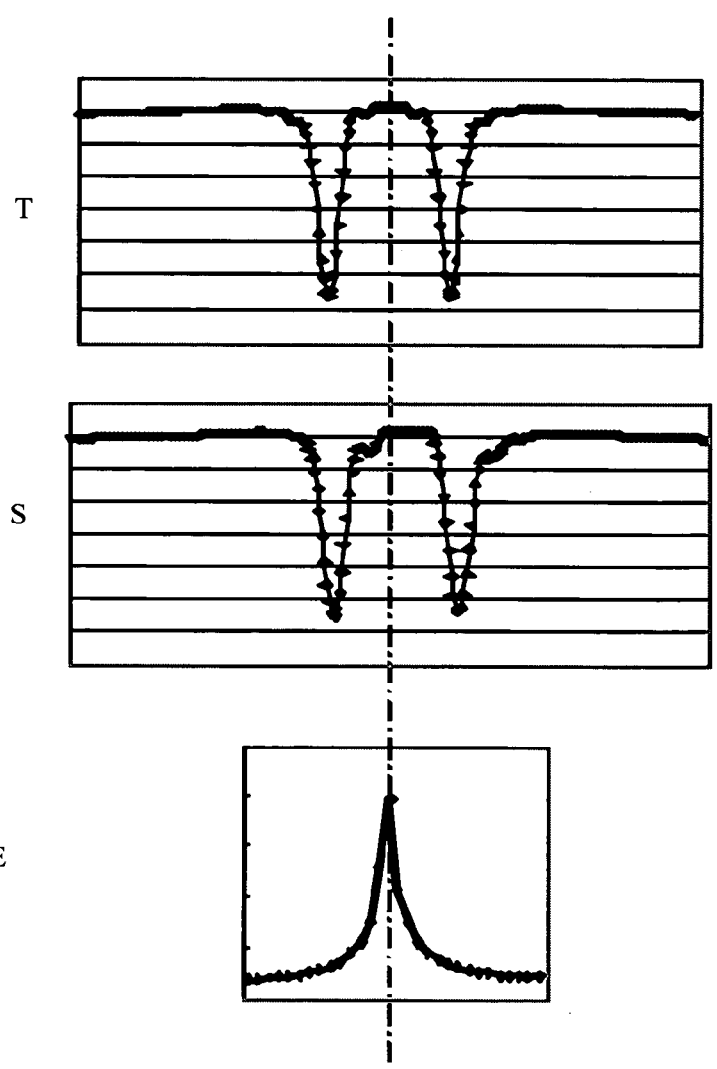
FIG. 6 is a graph obtained by a template matching method for measuring a positional center in the alignment mark shown in FIG. 3.

A description will be given of processing by the alignment signal processor 160. The instant embodiment uses template matching to calculate a position of an alignment mark 210. The template matching correlates an obtained signal S with a template T in FIG. 6, which template has been stored in the apparatus, and detects a position having the highest correlation as a center of the alignment mark. Here, FIG. 6 is a graph obtained by measuring a center position of the alignment mark 210 shown in FIG. 3 by the template matching. A resolution 1/10 to 1/50 is available by calculating a barycenter pixel position in an area that ranges several pixels to the right and left from the peak pixel using a function of a correlation value E shown in FIG. 6. Equation 1 determines a correlation result E where S is a signal obtained by the sensor, and T is a template:

$$E(X) = \frac{1}{\sum_{J=-k}^{k} [S(X+J) - T(J)]^2} \quad (1)$$

FIG. 6 shows processing to one of four alignment marks 210. The template matching similarly detects image positions on the sensor for other three alignment marks. The template matching calculates mark image positions X1(n), X2(n), X3(n) and X4(i) (with unit of pixel), where "n" is a shot number. Equation 2 determines averaged positions Xa of respective mark images:

$$Xa(n)=[Xb\ 1(n)+X2(n)+X3(n)+X4(n)]/4 \quad (2)$$

Equation 3 calculates a positional offset Xw(n) of the mark image, where Xa is an average value of the mark image on the wafer that has been obtained for each template, M is an imaging magnification of the alignment detection optical system 100, and Px is a pixel pitch of an area sensor in the alignment measurement direction:

$$Xw(n)=Xa(n)/(Px \cdot M) \quad (3)$$

Based on Equation 3, the alignment signal processor 160 calculates the positional offset amount Xw of the alignment mark from a mark image signal obtained by the line sensor 149.

A waveform evaluation value for the above mark is calculated based on a certain criterion of evaluation. An alignment position X is finally determined using the waveform evaluation value and positional offset amount Xw, as will be described in detail later.

A description will now be given of an alignment method for the wafer 200 based on position measurement values calculated by the alignment signal processor 160. The present invention adopts an advanced global alignment ("AGA"), which selects some shots (these selected shots are referred to as "sample shots") among all the shots or chips on a wafer, and detects positions of the alignment marks in the shots.

Figure 7:
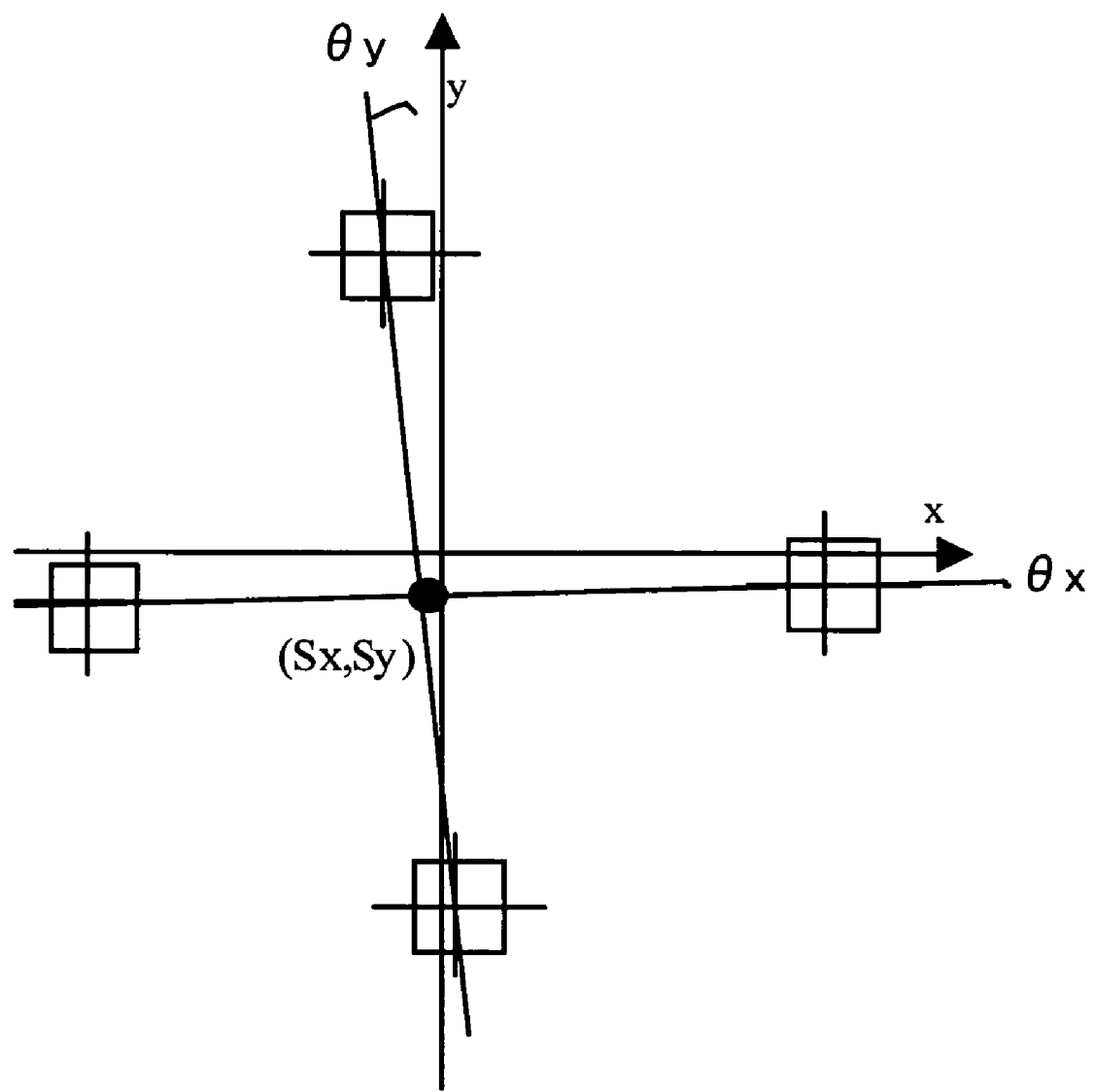
FIG. 7 is a schematic view showing offsets in a shot arrangement on a wafer in a xy coordinate system on a wafer stage in the exposure apparatus shown in FIG. 1.

As shown in FIG. 7, an offset of the wafer is described with six parameters including a shift Sx in the direction x, a shift Sy in the direction y, an inclination θx to the x-axis, an inclination θy to the y-axis, a magnification Bx in the direction x, and a magnification By in the direction y. Here, FIG. 7 is a schematic view showing an offsetting shot arrangement on a wafer in a xy coordinate system on a wafer stage in the exposure apparatus 10 shown in FIG. 1. Bx and By (not shown) represent an expansion and contraction of the wafer based on wafer stage feeding in the exposure apparatus, and are caused by a film formation and etching in the semiconductor process.

Equation 4 determines measurement values Ai for AGA sample shots measured by the above method (where "i" is the measurement shot number):

$$Ai = \begin{bmatrix} xi \\ yi \end{bmatrix} \quad (4)$$

Equation 5 determines designed positional coordinates Di of the alignment marks for the sample shots:

$$Di = \begin{bmatrix} Xi \\ Yi \end{bmatrix} \quad (5)$$

AGA performs the following primary coordinate conversion D'i using the above six parameters (Sx, Sy, θx, θy, Bx, By) that represent wafer's positional offsets. Equation 6 defines the coordinate conversion D'i:

$$D'i = \begin{pmatrix} Bx & -\theta y \\ \theta x & By \end{pmatrix} Di + \begin{pmatrix} Sx \\ Sy \end{pmatrix} \quad (6)$$

Equation 6 approximated θx and θy are minute (0) and Bx=By1, cos θ=1, sin θ=0, θx·Bx=θx, θy·By=θy, etc.

Figure 8:
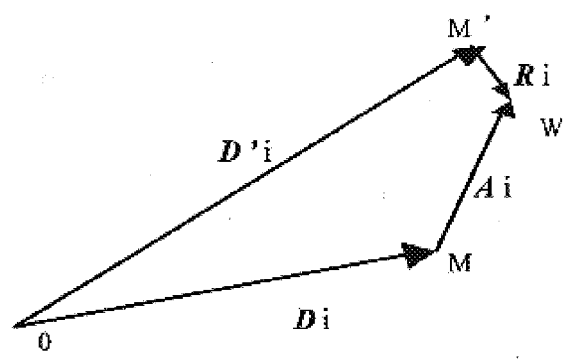
FIG. 8 is a schematic view showing a relationship between a coordinate conversion and a correction residual.

As shown in FIG. 8, the alignment mark 210 is located at a position W on the wafer 12, offset by Ai from a position M as a designed position M, and causes a positional offset (or residue) Ri of the alignment mark 210 on the wafer after the coordinate conversion D'i. FIG. 8 schematically shows the coordinate conversion D'i and the corrective residue Ri. Equation 7 determines the residue Ri:

$$Ri=(Di+Ai)-Di' \quad (7)$$

AGA applies the least square method to minimize the residue Ri for each sample shot, or calculates (Sx, Sy, θx, θy, Bx, By) that minimizes averaged square sum of the residue Ri. Equations 8 and 9 determine V:

$$V = \frac{1}{n}\sum_{i=1}^{i=n} \left| \begin{pmatrix} xi \\ yi \end{pmatrix} - \begin{pmatrix} Bx-1 & -\theta y \\ \theta x & By-1 \end{pmatrix} \begin{pmatrix} Xi \\ Yi \end{pmatrix} - \begin{pmatrix} Sx \\ Xy \end{pmatrix} \right|^2 \quad (8)$$

$$\begin{pmatrix} \frac{\delta V}{\delta Sx} \\ \frac{\delta V}{\delta Sy} \\ \frac{\delta V}{\delta Rx} \\ \frac{\delta V}{\delta Ry} \\ \frac{\delta V}{\delta Bx} \\ \frac{\delta V}{\delta By} \end{pmatrix} = 0 \quad (9)$$

AGA parameters (Sx, Sy, θx, θy, Bx, By) are obtained by substituting for Equations 8 and 9, measurement values (xi, yi) for each sample shot and alignment-mark designed position (Xi, Yi). A CPU 170 operates a wafer stage 17 based on the AGA parameters for alignments of respective shots on the wafer 200. Thereafter, the exposure follows.

A description will now be given of changes of a positional offset measurement value and a signal waveform, when the alignment detection optical system 100 has a coma and the alignment mark 210 changes a step.

Figure 9:
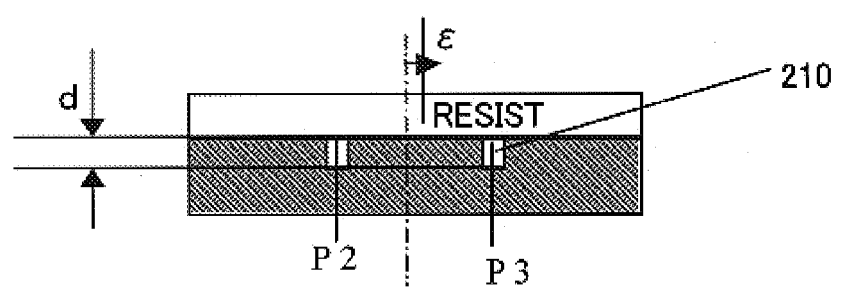
FIG. 9 is a schematic sectional view showing an alignment mark.
Figure 10:
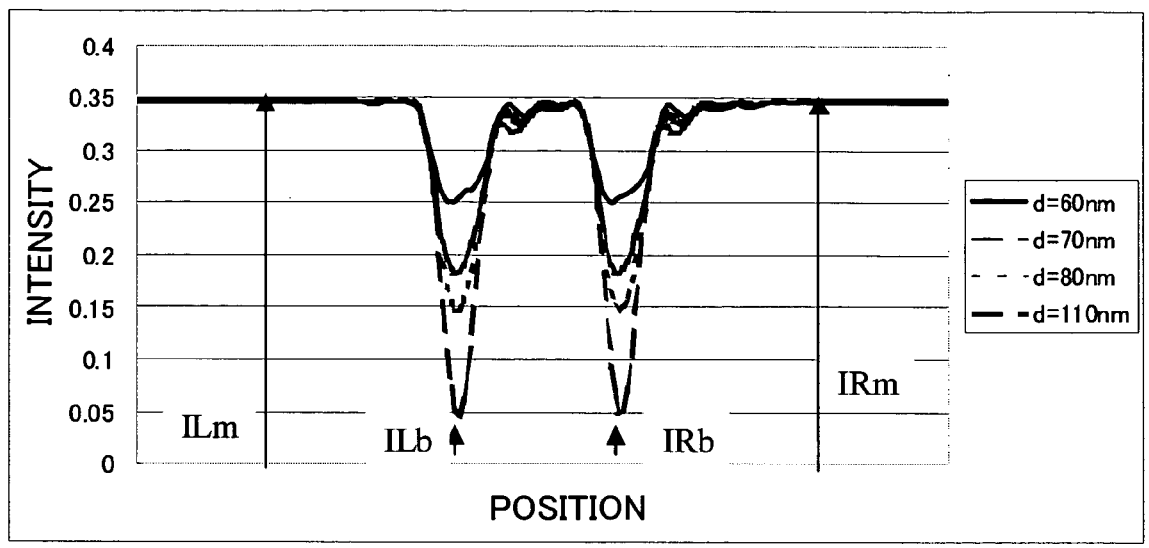
FIG. 10 is a graph showing a step dependency of the alignment mark shown in FIG. 9.
Figure 11:
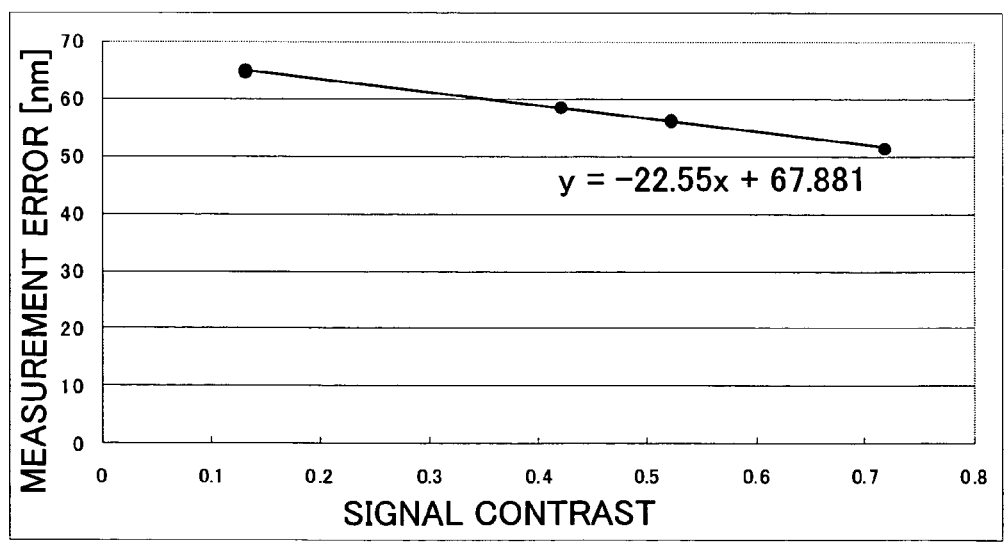
FIG. 11 is a graph showing a relationship between a mark image contrast and a measurement error.

FIG. 10 shows a waveform of the alignment signal, when a mark step d in FIG. 9 is d=60 nm, 70 nm, 80 nm and 110 nm. Here, FIG. 9 is a schematic sectional view showing an alignment mark 210. FIG. 10 is a graph showing the step dependency of the alignment mark 210. The alignment detection optical system 100 has NA of 0.4, s of 0.9, circularly polarized light, a wavelength of 633 nm of a He—Ne laser, and a coma of 0.1 λ. As shown in FIG. 10, the signal's contrast changes in accordance with mark's steps. A mark image corresponding to each step is calculated. There is a strong correlation between the signal contrast and the measurement error as shown in FIG. 11 as a result of calculations of Equation 3 using the above template matching. Here, FIG. 11 is a graph showing a relationship between a mark image's contrast (ILb/ILm) and a measurement error. Thus, given a relationship between a mark image's contrast (ILb/ILm) and a measurement error, a position of the alignment mark 210 is precisely detected by correcting a measurement value using the signal's contrast, even when there are asymmetric errors, such as an aberration of the alignment detection optical system 100, step changes of the alignment mark 210, and mark-width changes. Equation 10 determines a true positional offset amount M (an offset amount of a midpoint between P2 and P3 in FIG. 9), where M1 is a measurement value of a position of the mark image, E is a signal contrast of a waveform evaluation value of the mark image, and a is a corrective coefficient.

$$M = M1 - a \cdot E \qquad (10)$$

While the instant embodiment exemplarily calculates a signal contrast as a waveform evaluation value as ILb/ILm, the waveform evaluation value can use the intensity of ILb or an average contrast of the left and right signals.

Figure 12:
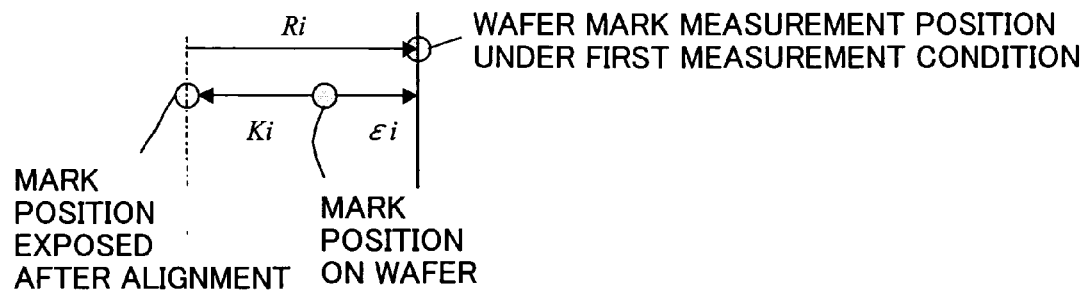
FIG. 12 is a schematic view showing a measurement error relationship between an alignment measurement value and a value measured by an overlay inspection apparatus.

Next follows a description of a calculation of the corrective coefficient a. A first method provides an alignment for respective shots on the wafer 200 using the steps of measuring sample shots in first and second measurement conditions in the above AGA, storing measurement values and residuals Ri for each shot, substituting measurement values (xi, yi) for each sample shot and alignment mark design positions (Xi, Yi) for Equations 8 and 9 using only measurement values measured in the first measurement condition so as to calculate AGA parameters (Sx, Xy, θx, θy, Bx, By), and actuating the wafer stage 17 through the CPU 170 based on the AGA parameters. Then, the exposure follows. A first overlay inspection mark is formed with the alignment mark on the wafer 200 as shown in FIG. 12, and a second overlay inspection mark is exposed onto the resist on the first overlay evaluation mark after the AGA alignment. Here, FIG. 12 is a schematic view showing a measurement error relationship between an alignment measurement value and a value measured by an overlay inspection apparatus. An overlay inspection apparatus (not shown) measures positional offset amounts of the first and second overlay evaluation marks in the AGA sample shots. The corrective residuals Ri (i is the shot number) measured by the AGA should accord with the measurement value Ki (i is the shot number) measured by the overlay inspection apparatus although they have inverse signs. However, when the alignment detection optical system contains asymmetrical errors, such as a coma, they are different according to steps among the alignment marks and trick components ei generated from the mark width changes. The trick component ei can be calculated as ei=Ri+Ki (i is the shot number).

Figure 13:
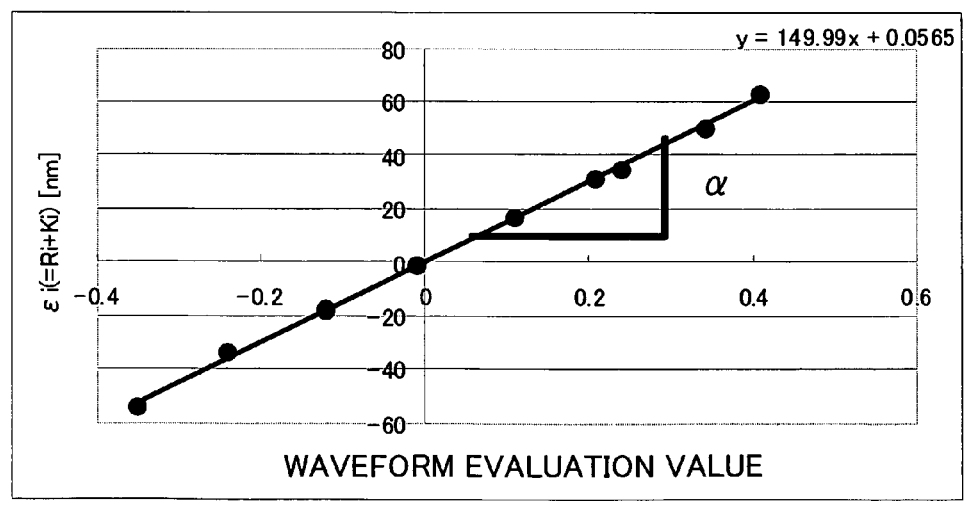
FIG. 13 is a graph showing a relationship between a trick component and a waveform evaluation value.

Next, a mark image contrast relationship between the trick component ei and the measurement value M1i is obtained. FIG. 13 is a correlation diagram for each shot between a trick component ei and a waveform evaluation value E, and an approximated line calculated by the least squares method. Here, FIG. 13 is a graph showing a relationship between a trick component and a waveform evaluation value. The approximated line is calculated by the least squares method based on the waveform evaluation value E and the trick component ei, and the gradient of the line is set to a. This method determines a value of the corrective coefficient a using the overlay inspection apparatus. Instead of using the overlay inspection apparatus, a method using an electric characteristic referred to as an electric measurement and a length SEM can be used to calculate an exposed offset amount Ki. While the FIG. 13 linearly approximates a relationship between the waveform evaluation value E and trick component ei, a quadratic or higher order function may be used to express the relationship. The first method is a method to expose after the alignment, detect the exposed wafer using an inspection apparatus, such as an overlay inspection apparatus, and calculate the corrective coefficient a. Alternatively, a second method can calculate the corrective coefficient a that minimizes the AGA residual Ri, using the steps of setting an arbitrary value of the corrective coefficient a, and setting a positional offset amount of the alignment mark for each shot using Equation 10, calculating AGA parameters (Sx, Xy, θx, θy, Bx, By) by substituting these values into Equations 8 and 9, calculating the corrective residual Ri using Equation 7, and the standard deviation (s) (or the maximum value). Thus, values of the corrective coefficient a are changed to repeat similar processes, and to obtain a value that provides the minimum residual Ri.

A combination that provides the minimum residual Ri is used because the residual amount is a sum of a nonlinear distortion caused by the semiconductor process and the alignment measurement error (which is a sum of the wafer stage arrangement accuracy in the alignment accuracy) and a nonlinear distortion component is constant on the same wafer, and thus the smaller residual provides the higher alignment measurement accuracy.

A third method of determining the corrective coefficient a includes the steps of measuring a three-dimensional shape using a three-dimensional shape measuring apparatus to obtain a shape change amount of the alignment mark, entering error information, such as a coma, in the alignment detection optical system 100, calculating the mark image through simulations, and obtaining a relationship between the waveform evaluation value E and the measurement error e.

The corrective coefficient a is determined using an inspection apparatus, such as an overlay inspection apparatus, and a combination of the above three methods for a first wafer in the lot in the semiconductor manufacture process. Alternatively, the simulation determines the corrective coefficient a based on a measurement result of the alignment mark shape, and provides a fine adjustment to the corrective coefficient so that the residual Ri becomes the minimum near the determined value of a.

Figure 14:
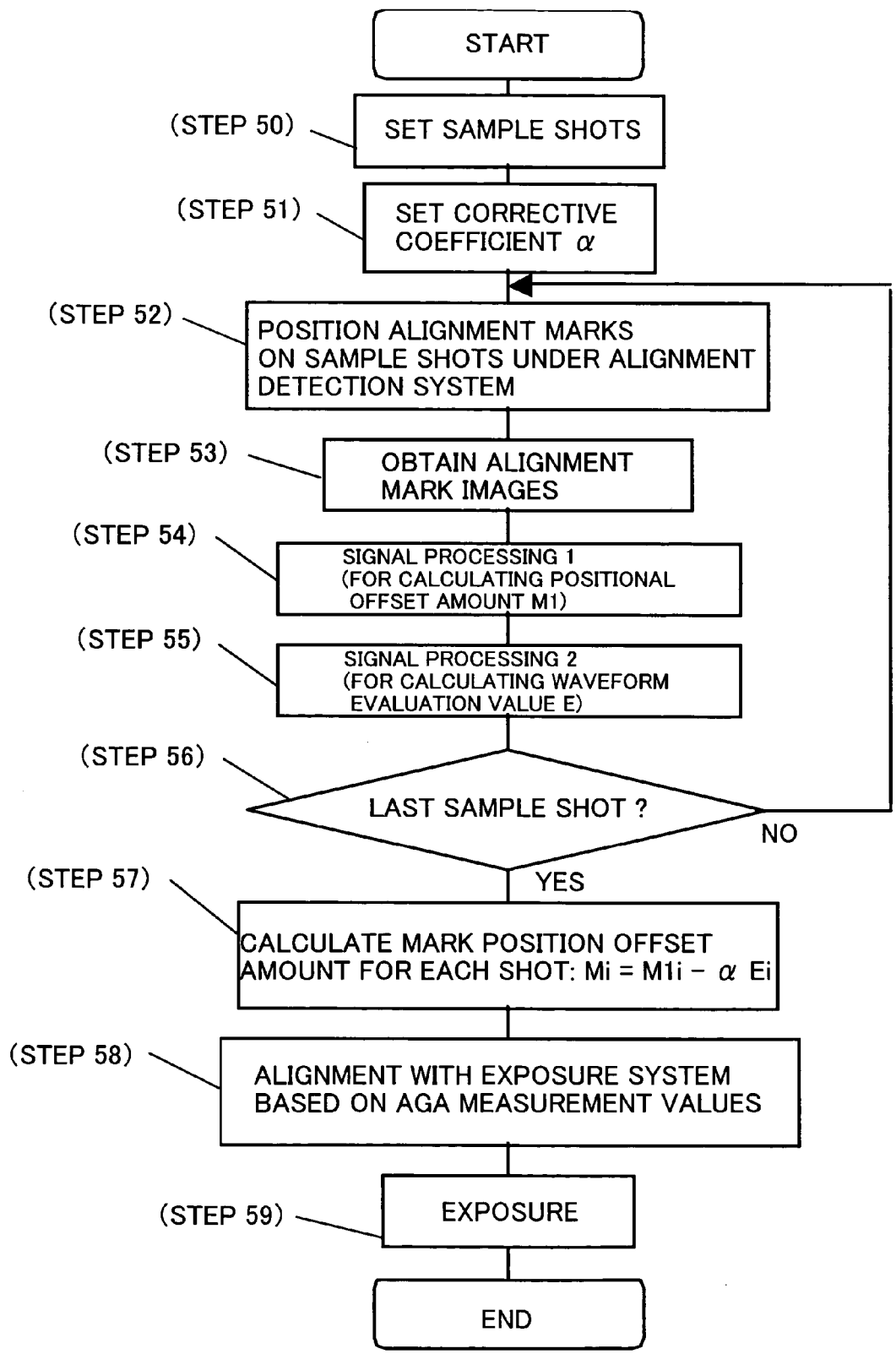
FIG. 14 is a flowchart of an alignment sequence.

A description will be given of the inventive alignment sequence with reference to a flowchart shown in FIG. 14. Here, FIG. 14 is a flowchart of the alignment sequence. Step 50 selects AGA measurement shots on the wafer 200. Then, step 51 sets a value of the corrective coefficient calculated by the above method. Then, step 52 arranges the alignment mark 210 in the sample shot on the wafer 200 mounted on the wafer stage 17, in place under the alignment detection optical system 100. Step 53 obtains an image of the alignment mark 210 through the alignment detection optical system 100. Step 54 calculates a positional offset amount M1 from the obtained mark image, and stores it in the exposure apparatus 10. Step 55 calculates the waveform evaluation value E of an image of the alignment mark 210, and stores it in the exposure apparatus 10. Next, step 56 determines whether there is another sample shot to be measured, based on information set in the step 50. If step 56 determines there is, the procedure returns to the step 52 for measurements and signal processing of all the sample shots.

Step 57 calculates the mark position offset amount Mi (where i is the shot number) using an equation of Mi=M1i−a·E where M1 is the first measurement value in step 54 and the waveform evaluation value E in step 55. The exposure apparatus executes an alignment based on the AGA measurement value calculated by step 58, and step 59 exposes and transfers a pattern on the reticle 12 onto the wafer 200.

Figure 15:
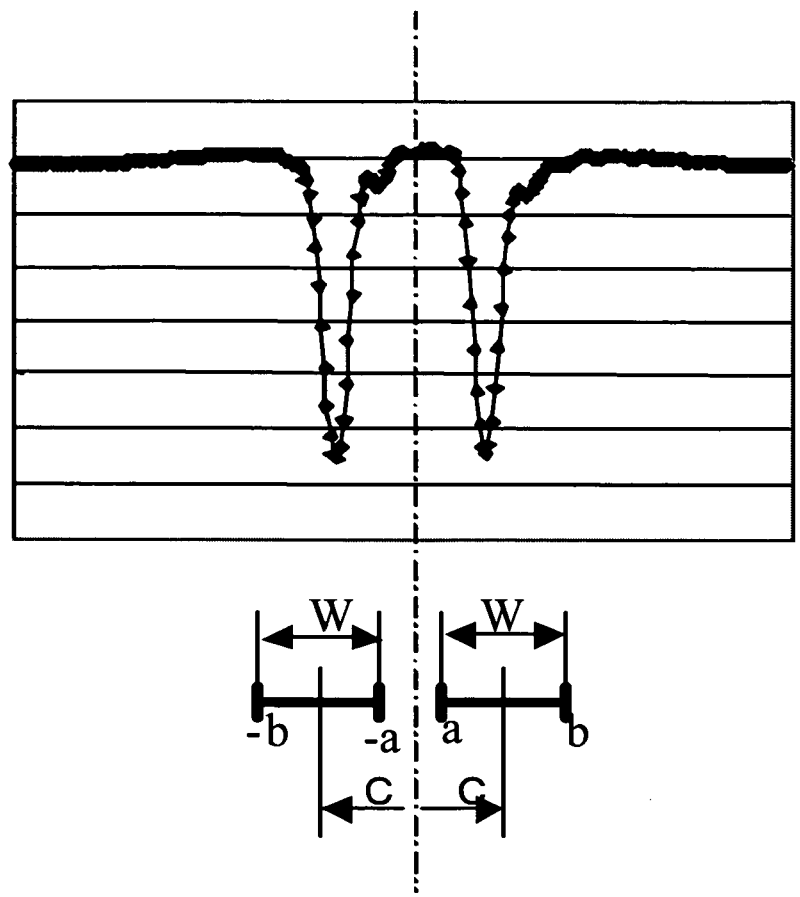
FIG. 15 is a graph that enlarges part of a signal in a mark image shown in FIG. 5, and shows a template folding a left-half signal.

In addition to the template matching, a process to calculate a position of a mark image can also use a method shown in FIG. 15. Here, FIG. 15 is a graph that enlarges part of a signal in a mark image shown in FIG. 5, and shows a template folding a left-half signal. Equation 11 determines a correlation value when a left-half signal waveform is regarded as a template.

$$E(x) = \frac{1}{\sum_{J=a}^{b} |S(X-J) - S(X+J)|} \quad (11)$$

The most correlative position is detected as a center between the alignment marks. A resolution 1/10 to 1/50 is available by calculating a barycenter pixel position in an area that ranges several pixels to the right and left from the peak pixel using a function of the correlation value E. A position of each mark image on the sensor is similarly detected for other three alignment marks. Then, Equation 2 determines averaged positions Xa(n) of respective marks, and Equation 3 calculates a positional offset Xw(n) of the alignment mark 30 on the wafer.

A description will now be given of a second embodiment of the present invention. While the first embodiment uses the alignment detection optical system 100 to acquire the waveform evaluation value E and a position of the mark image of the alignment mark, the instant embodiment uses an alignment detection optical system, which is sensitive to changes of shapes of the alignment mark 210, to acquire the waveform evaluation value and a position of the alignment mark image. More specifically, a coherence factor (s) in the illumination optical system is set to 0.3 to obtain the waveform evaluation value and a coherence factor (s) in the illumination optical system is set to 0.9 to obtain the position of the alignment mark image, when a variable aperture stop 126 is driven in the alignment detection optical system 100 shown in FIG. 2.

Figure 16:
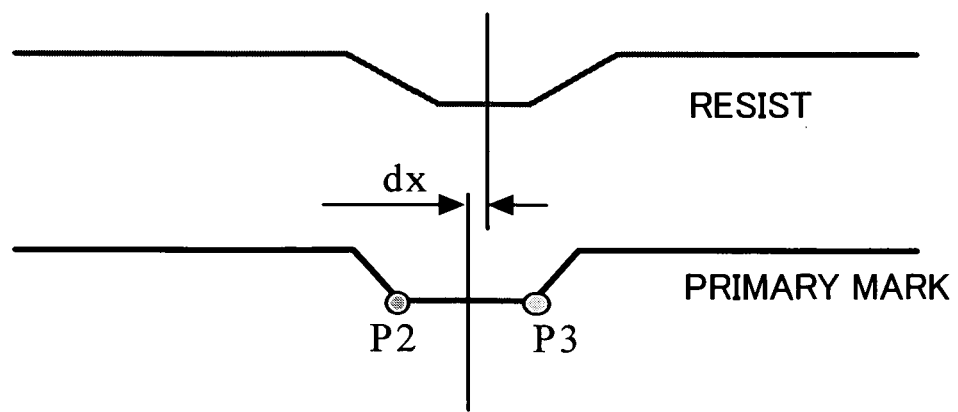
FIG. 16 is a schematic sectional view showing a calculation model of an asymmetrical mark.
Figure 17:
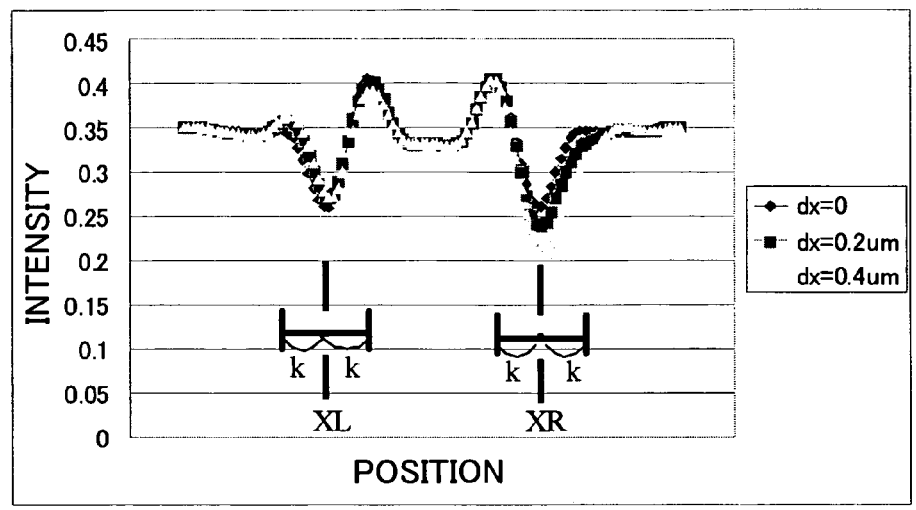
FIG. 17 is a graph of a waveform evaluation value of a second embodiment according to the present invention.

FIG. 16 is a schematic sectional view showing a calculation model of an asymmetric mark. More specifically, it is a schematic sectional view of a calculation model of the asymmetric mark where an uneven application offsets the resist on the alignment mark (or the primary mark) on the substrate by dx in a position measurement direction from the primary mark center. FIG. 17 is a graph showing a waveform evaluation value of a second embodiment according to the present invention, where the resist shift amounts dx are set to dx=0, 0.2 μm and 0.4 μm. The alignment detection optical system is used to calculate the waveform evaluation value and has NA of 0.4, s of 0.3, circularly polarized light, and a wavelength of 633 nm of a He—Ne laser.

Referring to FIG. 17, the calculation method of the waveform evaluation value E of the instant embodiment first sets minimum positions XL and XR corresponding to the mark's edge parts, calculates a differential value in a predetermined range k of a signal that is folded about XL as a center and a differential value in a predetermined range k of a signal that is folded about XR as a center, and acquires the waveform evaluation value E as a difference between these differential values. Equation 12 determines the waveform evaluation value E, where F is a function of the number of the alignment mark images:

$$E = \sum_{n=0}^{k} \{|F(X_L+n)| - |F(X_L-n)|\} - \sum_{n=0}^{k} \{|F(X_R-n)| - |F(X_R+n)|\} \quad (12)$$

Figure 18:
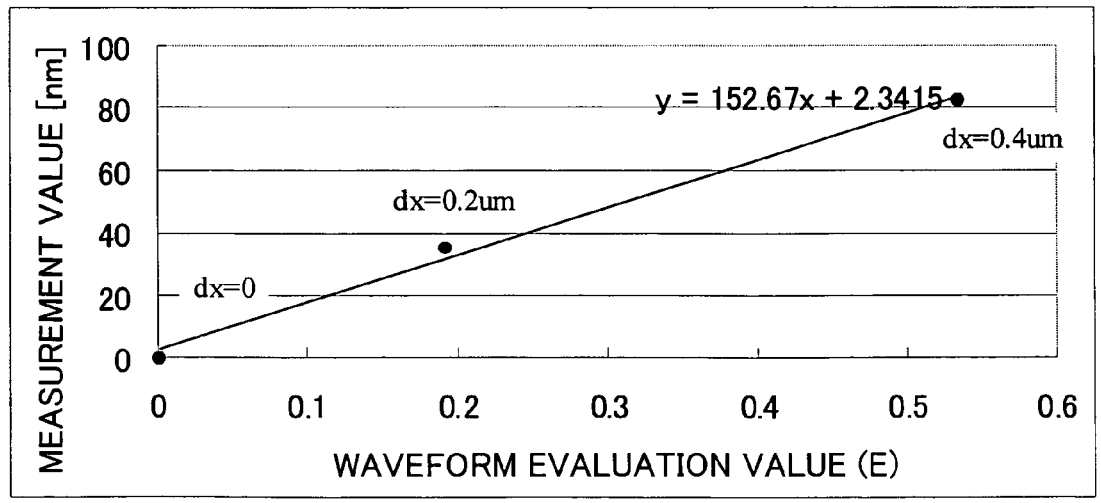
FIG. 18 is a graph showing a relationship between a measurement error and a waveform evaluation value of a second embodiment according to the present invention.

FIG. 18 shows a relationship between the waveform evaluation value E and the measurement error (or the positional offset amount e). The positional offset amount e from a center position between P2 and P3 is calculated by Equation 3 using the template matching, when the alignment mark shape shown in FIG. 16 is measured by the alignment detection optical system that has NA of 0.4, s of 0.9, circularly polarized light, and a wavelength of 633 nm of a He—Ne laser. Here, FIG. 18 is a graph showing a relationship between a measurement error and a waveform evaluation value of a second embodiment according to the present invention. As shown in FIG. 18, a relationship between the waveform evaluation value E and the measurement error is approximated to a direct function. Given a relationship between the waveform evaluation value E and the measurement error e, a precise alignment is executed with no influence of the asymmetric error of the alignment mark by calculating the waveform evaluation value E from Equation 12 and correcting the measurement value of the alignment mark image.

A calculation of the corrective coefficient a and the AGA are the same as those in the first embodiment, and a description thereof will be omitted.

A description will now be given of a third embodiment according to the present invention. This embodiment uses an alignment detection optical system having a single wavelength, which is sensitive to changes of shapes of the alignment mark, to acquire the waveform evaluation value, and an alignment detection optical system 100A having broadband ("BB") light with a wave range of about 150 nm to detect a position of the mark image. The single wavelength generates multiple interferences to a semi-permeable membrane, such as a resist, and the mark image sensitively changes according to changes of the coating thickness. On the other hand, the BB light restrains influence of the multiple interferences and the mark image hardly changes according to changes of the coating thickness.

Figure 19:
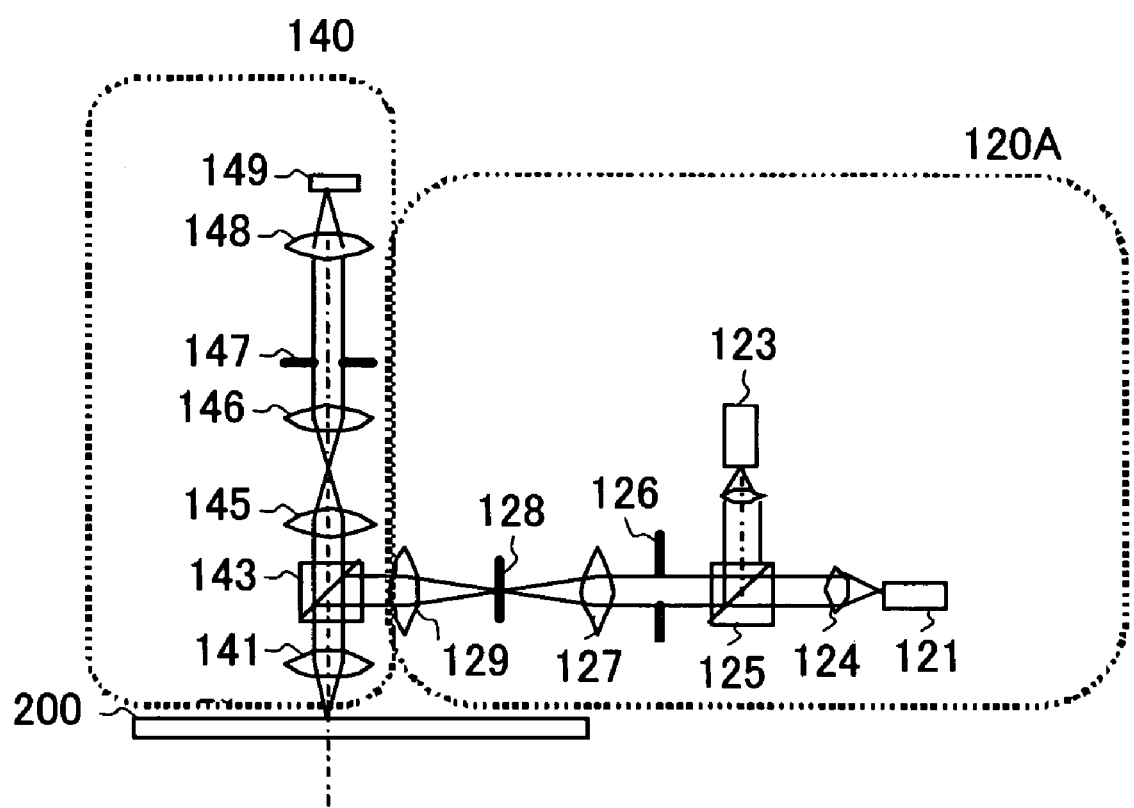
FIG. 19 is a schematic sectional view showing a variation of the alignment detection optical system shown in FIG. 2.

FIG. 19 is a schematic sectional view of a modification of the alignment detection optical system 100 shown in FIG. 2. The alignment detection optical system 100A shown in FIG. 19 is different from that shown in FIG. 2 in the illumination optical system 120. The illumination optical system 120A uses two light sources, such as a He—Ne laser 123 and a BB light source 121 (halogen lamp), and the rays from both light sources are configured to pass through the same optical path by the beam splitter 125.

A switching means (not shown) switches the He—Ne laser 123 and the BB light source 121 so that only the He—Ne laser 123 is irradiated onto the wafer 200 in the waveform evaluation acquisition step, and only the BB light 121 is irradiated onto the wafer 200 in the mark image position detection step. The variable aperture stop 126 has such a variable opening size that the illumination optical system s is set to 0.3 when the He—Ne laser 123 is irradiated, and s is set to 0.9 when the BB light 121 is irradiated.

An optical system subsequent to the beam splitter 125 has the same structure as that shown in FIG. 1, and a description thereof will be omitted.

A description will now be given of a calculation result of the waveform evaluation value and the measurement value in the instant embodiment. A target calculation model is as shown in FIG. 16 where an uneven application offsets the resist on the alignment mark (or the primary mark) on the substrate by dx from a center of the primary mark in a position measurement direction.

Figure 20:
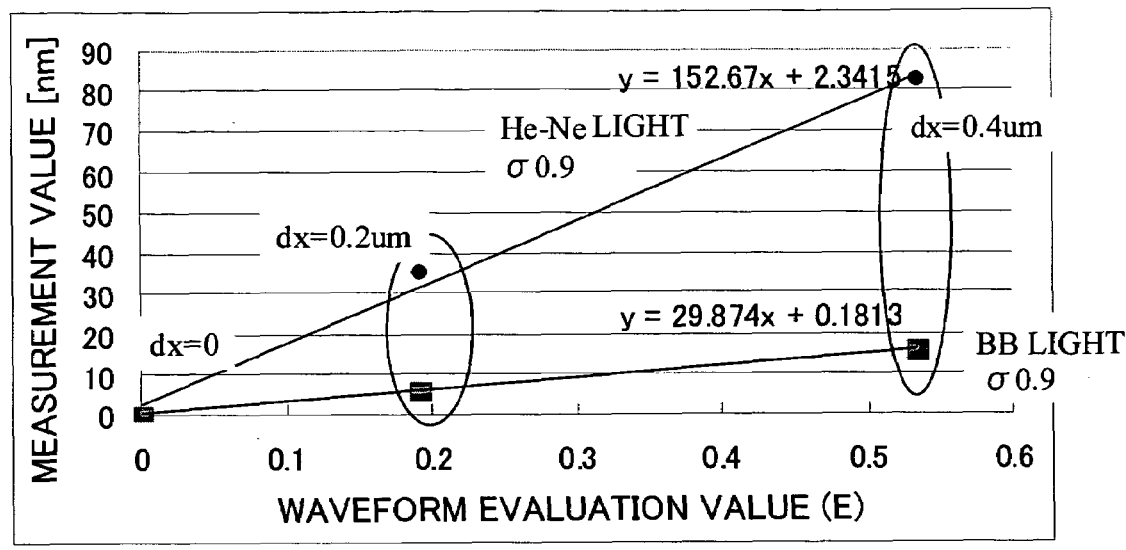
FIG. 20 is a graph showing a relationship between a measurement error and a waveform evaluation value of a third embodiment according to the present invention.

FIG. 20 shows a relationship between the waveform evaluation value E and the measurement error (or the positional offset amount e). The positional offset amount e from a center position between P2 and P3 is calculated by Equation 3 using the template matching, when the alignment mark shape shown in FIG. 16 is measured by the alignment detection optical system 100A that has NA of 0.4, s of 0.9, circularly polarized light, and a wave range of 150 nm from 550 nm to 700 nm. Here, FIG. 20 is a graph showing a relationship between a measurement error and a waveform evaluation value of a third embodiment according to the present invention. The alignment detection optical system for calculating a waveform evaluation value has NA of 0.4, s of 0.3, circularly polarized light, and a wavelength of 633 nm of a He—Ne laser 123, and the waveform evaluation value E is the same value as that of the second embodiment and calculated in Equation 12. The alignment detection optical system 100A that has NA of 0.4, s of 0.9, circularly polarized light, and a wavelength of 633 nm of a He—Ne laser 123 when used to calculate an image of the alignment mark would provide the calculation result shown in FIG. 20. A change rate of the measurement error to a change rate of the waveform evaluation value E (or an asymmetric change of the alignment mark) is significantly different between an illumination by the He—Ne laser 123 and an illumination by the BB light 121. It will be understood from FIG. 20 that the illumination by the BB light 121 is insensitive to the asymmetry of the alignment mark.

In this way, once a position of the mark image is detected, use of the alignment detection optical system that is insensitive to the mark's asymmetry can more effectively reduce the corrective error even when the waveform evaluation value E includes a measurement error.

A calculation of the corrective coefficient a and the AGA method are the same as those in the first embodiment, and a description thereof will be omitted.

Figure 21:
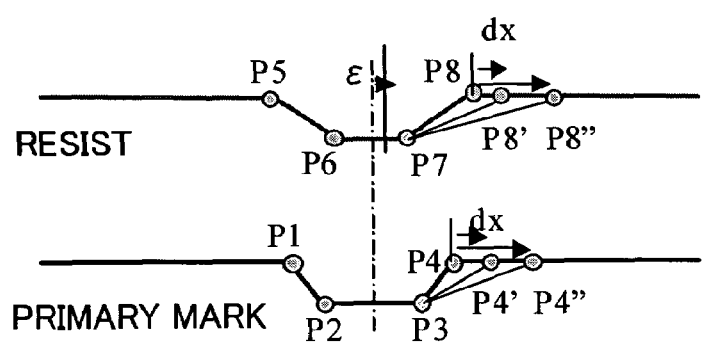
FIG. 21 is a schematic view showing an example of a primary mark covered by a resist.
Figure 22:
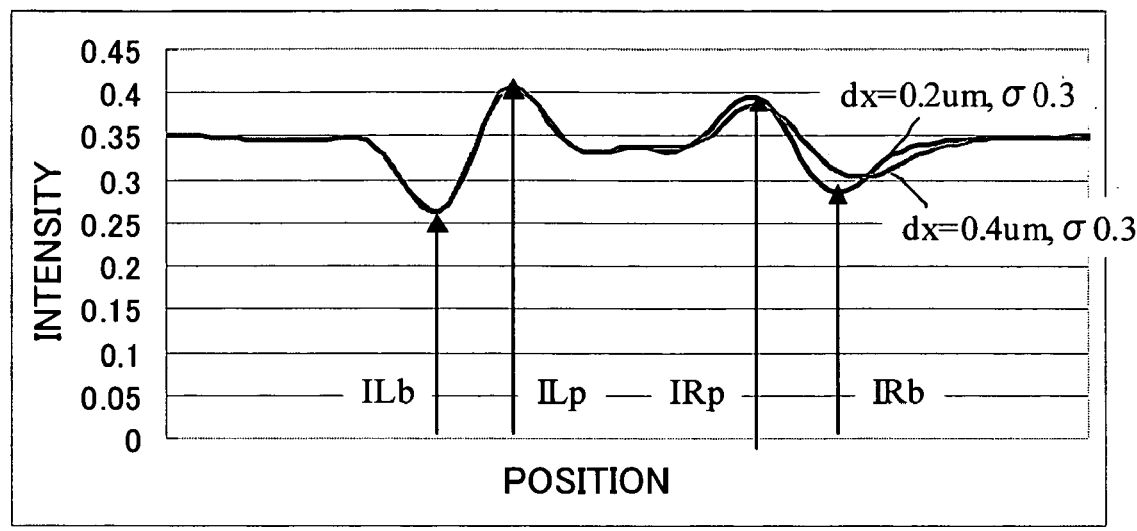
FIG. 22 is a graph obtained by calculating changes of the alignment mark image shown in FIG. 21.

A description will now be given of a fourth embodiment according to the present invention. The instant embodiment enables a desired position of the alignment mark 210 by correcting the alignment detection optical system based on the waveform evaluation value E of the mark image even when a shape of the primary mark contains an asymmetric error. FIG. 21 is a schematic view showing an example of a primary mark covered by the resist. FIG. 21 shows such a model that a position of a vertex P4 of the primary mark changes by dx=0, 0.2 µm and 0.4 µm, like P4' and P4", and a position of a vertex P8 of the resist changes by dx=0, 0.2 µm and 0.4 µm, like P8' and P8". FIG. 22 is a graph obtained by calculating changes of the alignment mark image shown in FIG. 21. The alignment detection optical system is used to calculate the waveform evaluation value, and has NA of 0.4, s of 0.3, circularly polarized light, and a wavelength of 633 nm of a He—Ne laser. Equation 13 calculates the left-side signal's maximum value ILp, the left-side signal's minimum value ILb, the right-side signal's maximum value IRp, and the right-side signal's minimum value IRP (by preferably using an average value of pixels among extreme values and adjacent left and right pixels), and determines the waveform evaluation value E of the instant embodiment by addressing waveform changes, as shown in FIG. 22:

$$E = (ILp - ILb) - (IRp - IRb) \quad (13)$$

Figure 23:
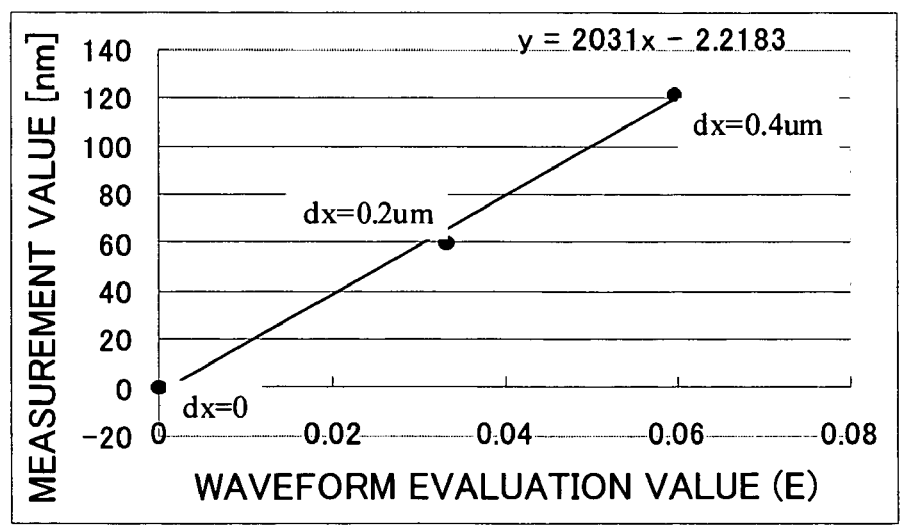
FIG. 23 is a graph showing a relationship between a measurement error and a waveform evaluation value of a fourth embodiment according to the present invention.

FIG. 23 shows a relationship between the waveform evaluation value E calculated based on Equation 13 and the positional offset value e from a center position between P2 and P3 in FIG. 21, which is calculated from Equation 3 using the template matching method and a simulation of the mark image. The simulation contemplates an image taken by the alignment detection optical system that has NA of 0.4, s of 0.9, circularly polarized light, and a wavelength of 633 nm of a He—Ne laser. Here, FIG. 23 is a graph showing a relationship between a measurement error e and a waveform evaluation value E of a fourth embodiment according to the present invention.

Thus, there is a linear relationship between the waveform evaluation value E described in Equation 13 and a measurement error, and a desired position of the alignment mark (which is a center between P2 and P3 in FIG. 21) can be precisely detected, even when the alignment mark has a symmetrical error, by calculating the waveform evaluation value E from a mark image taken by the alignment detection optical system and correcting the mark image position measurement value using a corrective equation as Equation 10.

A description will now be given of the way of applying wafers of the same semiconductor process to the alignment detection optical systems 100 in plural exposure apparatuses. In this case, it is necessary to control the measurement error TIS (Tool Induced Shift) caused by the alignment detection optical system. The major cause of the TIS results from an asymmetric aberration, such as a coma, and the telecentricity in the illumination optical system (perpendicularity of the principal ray to the wafer). The alignment detection optical system 100 that has a large TIS can enlarge the asymmetry of the alignment mark and cause a large measurement error. Therefore, when plural exposure apparatuses are used, the TIS in the alignment detection optical system is controlled in the exposure apparatus, and the same asymmetric error corrective coefficient a is applied to the exposure apparatus having an alignment detection optical system with a TIS within a predetermined threshold range. It is preferable to calculate the corrective coefficient a by the above method for the exposure apparatus having an alignment detection optical system with a TIS outside the threshold.

Figure 24:
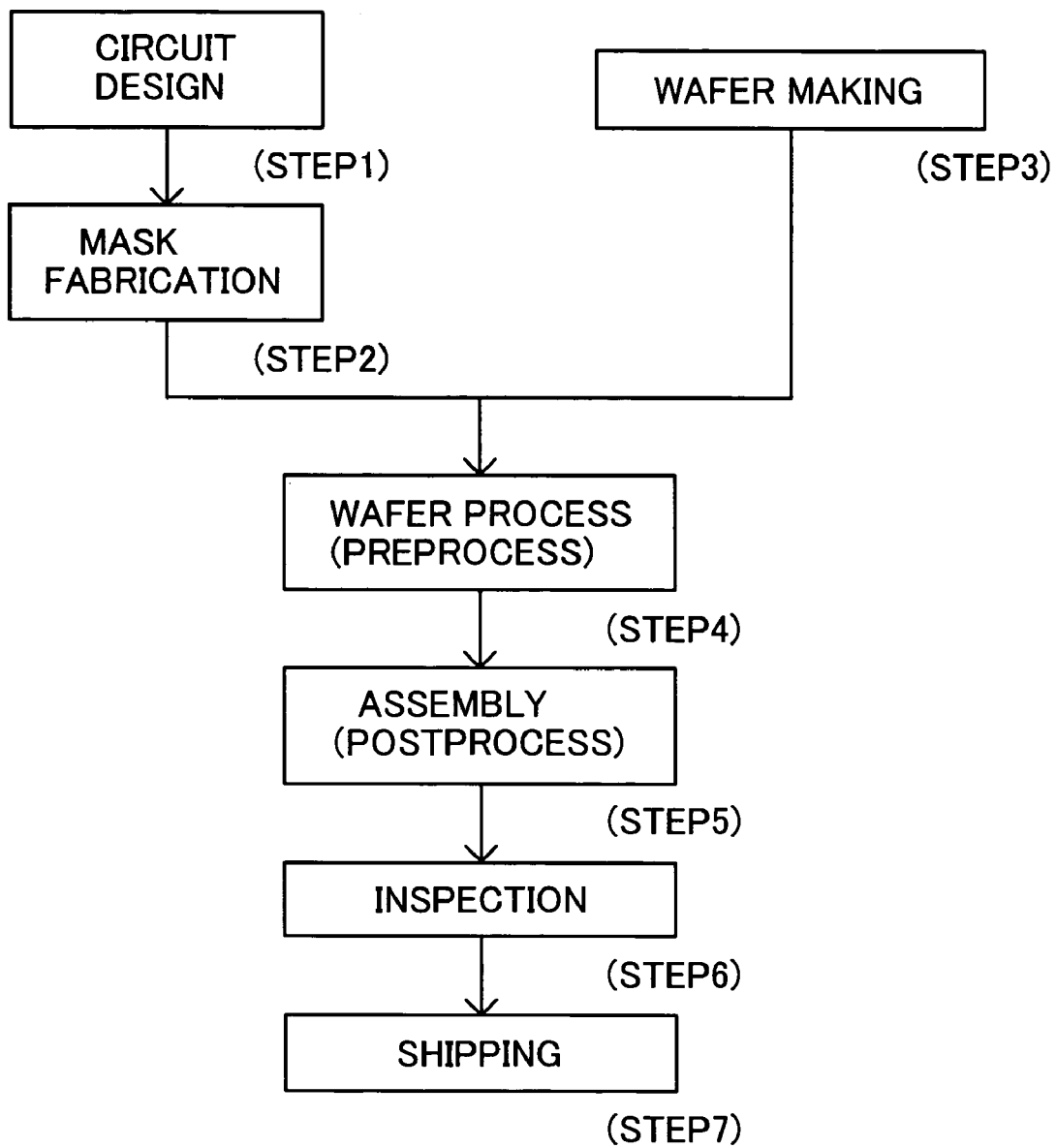
FIG. 24 is a flowchart for explaining a method for fabricating devices (semiconductor chips such as ICs, LSIs, and the like, LCDs, CCDs, etc.).
Figure 25:
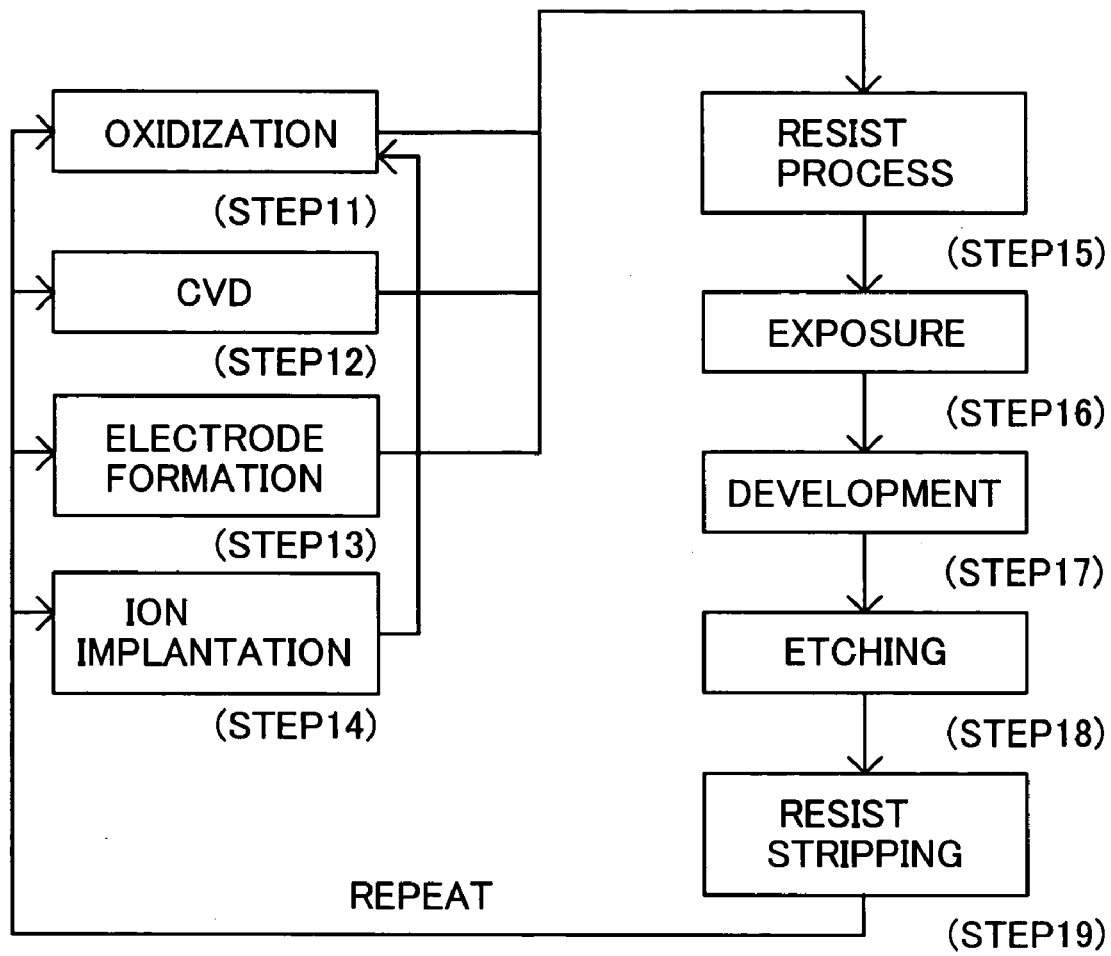
FIG. 25 is a detailed flowchart for Step 4 of wafer process shown in FIG. 24.

Referring now to FIGS. 24 and 25, a description will be given of an embodiment of a device fabricating method using the above exposure apparatus 10. FIG. 24 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 25 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one.

Thus, the present invention can maintain precision and improve yield in the semiconductor device manufacturing process even when alignment marks' shapes scatter. In addition, the present invention can shorten a time necessary to condition the semiconductor process necessary to stabilize a shape of the alignment mark and improve productivity of the semiconductor device manufacture.

What is claimed is:

1. An exposure method for exposing a pattern of a reticle onto a plate, said exposure method comprising the steps of:
   selecting a shot out of plural shots on the plate;
   taking a mark image of an alignment mark in a selected shot using an alignment detection optical system;
   calculating a position of the mark image;
   obtaining a contrast of the mark image;
   determining a position of the alignment mark based on a corrective equation,
   aligning the plate based on a determined position of the alignment mark; and
   exposing the pattern of the reticle onto an aligned plate,
   wherein the corrective equation meet $Mi = M1i - a \cdot Ei$ where i is the selected shot, $M1i$ is a calculated position of the mark image, $Ei$ is an obtained contrast of the mark image, and a is a corrective coefficient.

2. An exposure method for exposing a pattern of a reticle onto a plate, said exposure method comprising the steps of:
   selecting a shot out of plural shots on the plate;
   taking a mark image of an alignment mark in a selected shot using an alignment detection optical system;
   calculating a position of the mark image;
   obtaining an evaluation value of the mark image;
   determining a position of the alignment mark by correcting a calculated position of the mark image using an obtained evaluation value;
   aligning the plate based on a determined position of the alignment mark; and
   exposing the pattern of the reticle onto an aligned plate,
   wherein said obtaining step takes the mark image using the alignment detection optical system under a first measurement condition, and said calculating step takes the mark image using the alignment detection optical system under a second measurement condition different from the first measurement condition.

3. An exposure method according to claim 2, wherein a difference between the first and second measurement conditions is in coherence factor(s) of the alignment detection optical system.

4. An exposure method according to claim 2, wherein the first measurement condition is that an illumination condition of the alignment detection optical system uses a single wavelength, whereas the second measurement condition is that the illumination condition of the alignment detection optical system uses broadband light.

* * * * *